Jan. 16, 1962 H. R. LUBCKE 3,017,522

ELECTRICAL SEMICONDUCTOR COOLING BY USE OF PELTIER EFFECT

Filed Aug. 20, 1958

INVENTOR.
HARRY R. LUBCKE

United States Patent Office 3,017,522

Patented Jan. 16, 1962

3,017,522

ELECTRICAL SEMICONDUCTOR COOLING BY USE OF PELTIER EFFECT

Harry R. Lubcke, 2443 Creston Way, Hollywood 28, Calif.

Filed Aug. 20, 1958, Ser. No. 756,253
14 Claims. (Cl. 307—88.5)

My invention relates to electrical cooling and particularly to means for lowering the operating temperature of a semiconductor electronic valve device.

The several desirable attributes of semiconductor devices such as the transistor are well known. However, such devices exhibit undesirable changes in characteristics with temperature and reach inoperability at relatively low temperatures. Inoperability may be induced by electrical power dissipated in the device or may be brought about by elevated ambient temperatures.

A simple means for cooling the operative portion of a semiconductor device regardless of the source of heat is obviously valuable. I attain this by forming a junction with the semiconductor material and a suitable metal through which combination an electric current is passed. Electric cooling takes place according to the effect discovered many years ago by the French scientist Peltier.

I add an extra electrode to a semiconductor device such as a transistor. This electrode makes firm electrical and thermal contact to the main semiconductor wafer adjacent to but not contacting any of the junctions or contacts which comprise the transistor proper. Only a small cooling capability is required because of the small thermal capacity of the junction region per se of the transistor and because of fairly good thermal insulation from the gross parts of the transistor, such as its sealing metal case.

In general, a large reduction in junction temperature below usual room temperatures is not required. Rather, a thermal capacity to remove heat generated by transistor functioning so that a relatively uniform temperature can be maintained at the junctions.

I have discovered that antimony, for example, when held in thermal and electrical contact with N germanium and maintained electrically positive with respect to the N germanium while a current of a few milliamperes flows produces cooling the equivalent of many degrees Fahrenheit in the circuit operation of the semiconductor device involved. The antimony electrode is not formed as a junction nor chemically combined with the germanium, but is in firm physical contact with the germanium wafer, preferably with the aid of a spring or other means to insure that such contact is maintained.

An object of my invention is to electrically cool a semiconductor.

Another object is to cool a transistor junction or junctions to obtain the desirable electrical characteristics existing at reduced temperatures.

Another object is to prevent a rise in temperature of a transistor-like device because of the electrical functioning thereof.

Another object is to obtain transistor cooling with a small expenditure of electrical power.

Another object is to effect transistor cooling by means having small thermal inertia.

Another object is to effect transistor cooling by simple and inexpensive means.

Other objects will become apparent upon reading the following detailed specification and upon examining the accompanying drawings, in which are set forth by way of illustration and example certain embodiments of my invention.

Figure 1:
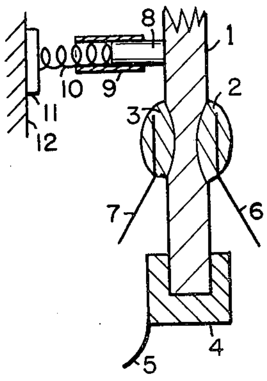
FIG. 1 shows the end elevation of a cooled semiconductor device.

In FIG. 1 numeral 1 indicates the sectional view of a wafer of N germanium. In forming the usual transistor two junctions are formed as by pressing in indium dots 2 and 3 on each side and heating in a furnace as known. As my invention has been practiced dot 2 has been the emitter and dot 3 the collector.

A contact 4 is normally provided to make intimate electrical connection to base 1 and another conductor 5 attached thereto for external circuit connection. Similar thin conductive straps 6 and 7 are provided as external connections to the emitter and the collector electrodes, respectively.

Of greater importance than the prior constructional details is the presence of the antimony electrode 8. This is pressed against the N germanium, preferably on one side and near the transistor junctions. The position near the junctions is chosen since it is the junctions that are to be cooled. It is important that the antimony electrode should not touch the junctions nor the connections therefrom. Should this occur the cooling effect is lost and the normal operation of the transistor usually seriously interfered with.

A completely antimony electrode may be employed in production and of relatively small size. However, in view of the somewhat brittle nature of that element I have preferred to mount a small piece of antimony, say a short cylinder 0.022" diameter, in a longer piece of copper tubing 9 having an internal diameter equal to the external diameter of the antimony. I have also employed a compression spring 10 to insure that intimate contact is maintained between the antimony and the N germanium. The spring is conveniently supported at the end opposite tubing 9 by a piece of insulation 11, which is in turn supported by the inside of the housing for the transistor 12.

Chemically pure grade of antimony has been employed.

It is desirable that the end of the antimony electrode be smooth, true and a good surface to surface fit with the N germanium. However, a somewhat rough surface does not negate the effect sought or result in any unusual decrease other than a first power loss of effectiveness due to loss of contact area. A desirable pressure to be exerted by spring 10 is of the order of an ounce. The contact should be firm but too great pressure will deform or fracture the N germanium wafer.

Figure 2:
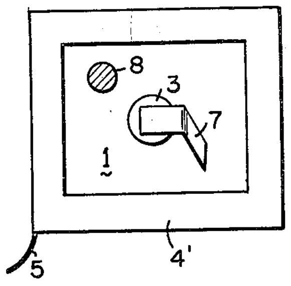
FIG. 2 shows a front elevation of an embodiment of this type.

The structural details of my important antimony electrode are not important, and so in FIG. 2 these have been omitted to more clearly show the placement of that electrode 8 with respect to the nearest junction 3. It is common to mount the wafer 1 in a completely surrounding base contact 4' as shown. With such an initial arrangement a desirable placement for electrode 8 is on a diagonal between the central junctions and the corner of the square or somewhat rectangular outer contact 4'.

Figure 3:
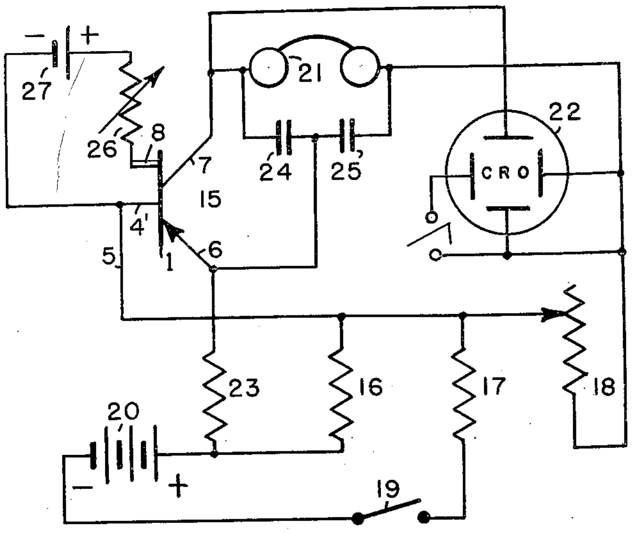
FIG. 3 shows a circuit diagram for testing transistor cooling.

For the major portion of the testing conducted to prove out my invention the oscillator circuit of FIG. 3 was employed. This had the advantage of operating the transistor in a typical application. It was found possible to select parameters which made the circuit operation definitely temperature sensitive with respect to the temperature of the transistor. The temperature effects sought for and attained were large, but should small temperature effects have been of interest it was possible to note a change of temperature of the transistor junctions of a fraction of a degree Fahrenheit.

The oscillator is of the audio frequency type and was operated in the range around 2,000 cycles. Transistor 15 is of the PNP type, such as the GE 2N190 and 2N188. The center slab is of N type germanium. The base connection 4′ connects to three resistors; resistor 16 of approximately 2,000 ohms resistance, resistor 17 of 3,000 ohms resistance, and variable resistor 18 of 0 to 20,000 ohms resistance. The second terminal of resistor 16 connects to the positive terminal of a 4½ volt battery. The second terminal of resistor 17 connects through an on-off switch 19 to the negative terminal of battery 20; the 4½ volt one. The second terminal of variable resistor 18 connects to a pair of head phones 21 for audible checking and also to one plate of the usual waveform oscilloscope 22. The collector connection 7 of the transistor connects to the second terminal of the headphones 21 and to the opposite plate of the oscilloscope 22; the vertical pair of plates.

The emitter connection 6 of transistor 15 is connected to resistor 23, which has a resistance of 20,000 ohms; and also to the center junction of two fixed capacitors 24 and 25, each of 0.01 microfarad capacitance. The other terminals of these capacitors are connected to the terminals of headphones 21. The horizontal deflection plates of oscilloscope 22 are connected to a sawtooth sweep circuit to allow examination of the waveform.

Antimony electrode 8 is connected to preferably a variable resistor 26 having a maximum resistance of a thousand ohms. The other terminal of resistor 26 is connected to a battery 27 having a voltage of 1½ volts. The positive terminal of the battery is connected to the resistor. The negative terminal of the battery 27 is connected to the base connection 4′. This makes the antimony electrode positive with respect to the N germanium.

Variable resistor 18 is the frequency control of the oscillator. It was found that by adjusting this control to near the high frequency end, i.e., at around 1,500 ohms, the oscillator was highly temperature sensitive with respect to the transistor. Accordingly, most tests were conducted with this adjustment. From a room temperature normally 64° F. ice was applied to transistor leads 4′, 6 and 7 and retained long enough to allow thermal equilibrium at 32° F. as a calibration point. Another element having a temperature of 92° F. was also similarly employed. At the low temperature the oscillator output would increase in frequency and decrease in amplitude. The reverse effects obtained at the high temperature. These variations were approximately linear over the range of interest. A change in amplitude of the order of 15 to one was obtained for the extreme temperatures mentioned.

It will be noted that the electrical circuits for the oscillator and for the cooling electrode are completely separate, save for an almost resistanceless common path through base connection 4′. The current through the N germanium wafer from the junctions largely passes downward to the lower portion of surrounding base contact 4′ as the path of lowest resistance while the current from the antimony electrode 8 passes largely to the upper left corner of contact 4′ (FIG. 2) as the path of lowest resistance. It will be understood that separate contacts may be made to the N germanium wafer only at the points mentioned and separate external leads provided. This would further separate the current paths in the germanium. However, the need for this alternate construction was not apparent in the investigations conducted and the simplicity of the construction employed is a manufacturing advantage.

With the structure, parameters and calibration of the special transistor and circuit described an electrical cooling of several degrees Fahrenheit was obtained with a current through the antimony electrode of ten milliamperes.

When all aspects of the structure and parameters were the same except that a copper electrode was employed instead of the antimony electrode there was no cooling effect whatsoever.

Under further similar conditions and with a bismuth electrode instead of antimony there was a heating effect.

Other current values than ten milliamperes may be employed for cooling effects with the antimony, of course, but values within the milliampere range are suggested.

Alternate structures are also possible.

While the antimony electrode has been shown on the collector side of the germanium wafer it may also be on the emitter side. The shape of the contacting surfaces may be other than circular; i.e., square, etc. The transistor construction may be altered as long as an area of the germanium wafer is available to receive the antimony contact. The spring 10 may be a leaf spring rather than the compression spring and the leaf may serve as the external lead at the same time.

The transistor junction is not coactive in the Peltier effect. Thus, a point contact diode, point contact transistor or any type of semiconductor device may be cooled according to my invention.

It is expected that to heat a semiconductor device is less often required than to cool it. However, as previously mentioned the use of a bismuth electrode with N germanium will provide heating. Also, a considerably higher voltage than required for cooling and of opposite polarity causes heating with the antimony electrode because of reverse current flow.

P type germanium may be worked against antimony for cooling. Antimony has a thermoelectrically fixed e.m.f. with respect to lead (Pb.), and it has the same polarity of e.m.f to either N or P germanium.

Resistor 26 has been shown variable and indicated as relatively adjacent to the junctions of the transistor. This is so a Varistor having a negative temperature coefficient may be employed to automatically alter the Peltier current flow and so compensate for ambient or electrical heat rises by increasing the cooling. The $I^2R$ loss in the Varistor is kept to a minimum by employing a minimum resistance value to prevent appreciable heating of the structure sought to be cooled by radiation or convection. Thermal contact is not made between the elements involved. Negative temperature coefficient carbon resistors, etc. may also be used instead of the Varistor.

Other modifications in the arrangement, size, proportions, and shape of my device may be made, as well as variations in the values and characteristics of the circuit elements, details of circuit connections, type of circuit cooled, and alteration of the coactive relation between circuit elements without departing from the scope of my invention.

Having thus fully described my invention and the manner in which it is to be practiced, I claim:

1. A semiconductor device comprising semiconductor material having a connection, plural contacts to said semiconductor material to valve electricity, an electrode having the thermoelectric characteristics of antimony directly mechanically contacting said semiconductor material adjacent to said contacts, and means to pass an electric current between said electrode and said connection through said semiconductor material to alter the thermal state of said semiconductor material adjacent to said contacts; said connection having a thermal dissipative capacity exceeding that of said contacts.

2. A device constituted to valve electricity for electrical oscillation comprising a semiconductor, elements contiguous to said semiconductor to valve said electricity, only one conductor of electricity capable of Peltier cooling directly mechanically contacting said semiconductor adjacent to said elements, and means to pass an electric current between said one conductor and said semiconductor to alter the thermal state of said elements, said means to pass an electric current connected to said semiconductor by a connection of thermal capacity exceeding that of said conductor and of said elements.

3. A transistor comprising a semiconductor with plural transistor-operative elements electrically contacting said semiconductor, a metal thermoelectric with respect to said semiconductor directly mechanically contacting said semiconductor under pressure adjacent to said transistor-operative elements, a base contact to said semiconductor having a large thermal capacity, and means to pass an electric current between said metal and said semiconductor to cool said transistor-operative elements.

4. A transistor device having a semiconductor, a contact thereto, and at least two junctions formed to said semiconductor, an electrode having the thermoelectric properties of antimony in direct mechanical contact with said semiconductor, said electrode disposed adjacently to said junctions, means for maintaining said electrode at a potential different with respect to that of said semiconductor to pass electric current between said electrode and said semiconductor for altering the thermal state of said junctions, the heat dissipation capability of said contact exceeding the heat capacity of the said junctions.

5. The transistor device of claim 4 in which said semiconductor is N germanium.

6. The transistor device of claim 4 in which said semiconductor is P germanium.

7. A semiconductor device having a germanium element and at least one contact and two junctions formed thereto, an antimony electrode electrically and thermally contiguous with said germanium element adjacent to said junctions and away from said one contact, the heat capacity of said one contact exceeding that of said junctions and that of said antimony electrode, means for maintaining said antimony electrode at a positive potential with respect to the potential of said germanium element to pass an electric current between said antimony and said germanium element for Peltier cooling of said junctions.

8. A thermally influenced semiconductor device having a thin N germanium element, a base contact and at least one PN junction formed to the N germanium, an antimony electrode in direct mechanical contact with said N germanium in close proximity to said PN junction, said base contact having a thermal dissipative capacity exceeding that of the sum of the other above-recited elements, means for maintaining said antimony electrode at a positive voltage with respect to that of said N germanium for producing a flow of electric current between said antimony electrode and said N germanium to accomplish electrical cooling of said PN junction.

9. A transistor subject to heating having an N germanium body and a base contact, a PN emitter junction and a PN collector junction formed to said body away from said base contact, said base contact having a heat dissipative capacity large in relation to the thermal capacities of said junctions, an antimony-like electrode in direct electrical, mechanical and thermal contact with said N germanium body in proximity to said PN and NP junctions and away from said base contact, an electrical circuit for maintaining said antimony-like electrode at a positive voltage with respect to the potential of said N germanium body and to cause an electric current to flow between said antimony-like electrode and said N germanium body to accomplish electrical cooling of said junctions.

10. An electrical device having a semiconductor element, an electrical connection thereto and an electrical valve contact formed to said semiconductor element, a single electrode having thermoelectric properties opposite to those of said semiconductor element, said single electrode in direct contact with said semiconductor element, the heat capacity of said connection exceeding that of said valve contact and said single electrode, means to maintain said single electrode at a potential difference with respect to said semiconductor element to pass a current therethrough, and temperature sensitive control means electrically connected to said single electrode to regulate said current and thereby to compensate for thermal change of said valve contact.

11. A device having a semiconductor, a contact thereto of large thermal capacity, at least one electric valve junction formed to said semiconductor, only one electrode having the thermoelectric properties of antimony in direct electrical and thermal contact with said semiconductor, means to maintain said one electrode positive with respect to said semiconductor and to pass a current therethrough to said contact, and a temperature-sensitive current control electrically connected to said means-to-maintain to regulate said current in a sense to compensate for thermal changes of said valve junction.

12. The device of claim 11 in which said semiconductor is N germanium.

13. The device of claim 11 in which said semiconductor is P germanium.

14. A transistor having an N semiconductor wafer, a base contact thereto and at least one P junction formed to said wafer, the thermal capacity of said base contact being greater than that of said junction, a single piece of metallic antimony in intimate electrical, mechanical and thermal contact with said wafer, means to maintain said antimony electrically positive with respect to said wafer and to pass current between said antimony and said wafer, and a negative thermal coefficient resistor in series with said means-to-maintain disposed adjacently to said junction to regulate said current and retain the temperature of said junction substantially constant.

References Cited in the file of this patent

UNITED STATES PATENTS

| | | |
|---|---|---|
| 2,693,572 | Chase | Nov. 2, 1954 |
| 2,776,372 | Ensink | Jan. 1, 1957 |
| 2,777,975 | Aigrain | Jan. 15, 1957 |
| 2,801,347 | Dodge | July 30, 1957 |
| 2,867,732 | Rutz | Jan. 6, 1959 |
| 2,989,743 | Bradley | Aug. 11, 1959 |

OTHER REFERENCES

Article, "The Peltier Effect" by Hartsaw, in Refrigeration Engineering, Sept. 1958, pages 31 to 33, 70.